May 24, 1955 J. A. COLLS 2,709,205
DIRECT COUPLED THERMIONIC VALVE AMPLIFIERS
Filed June 23, 1950
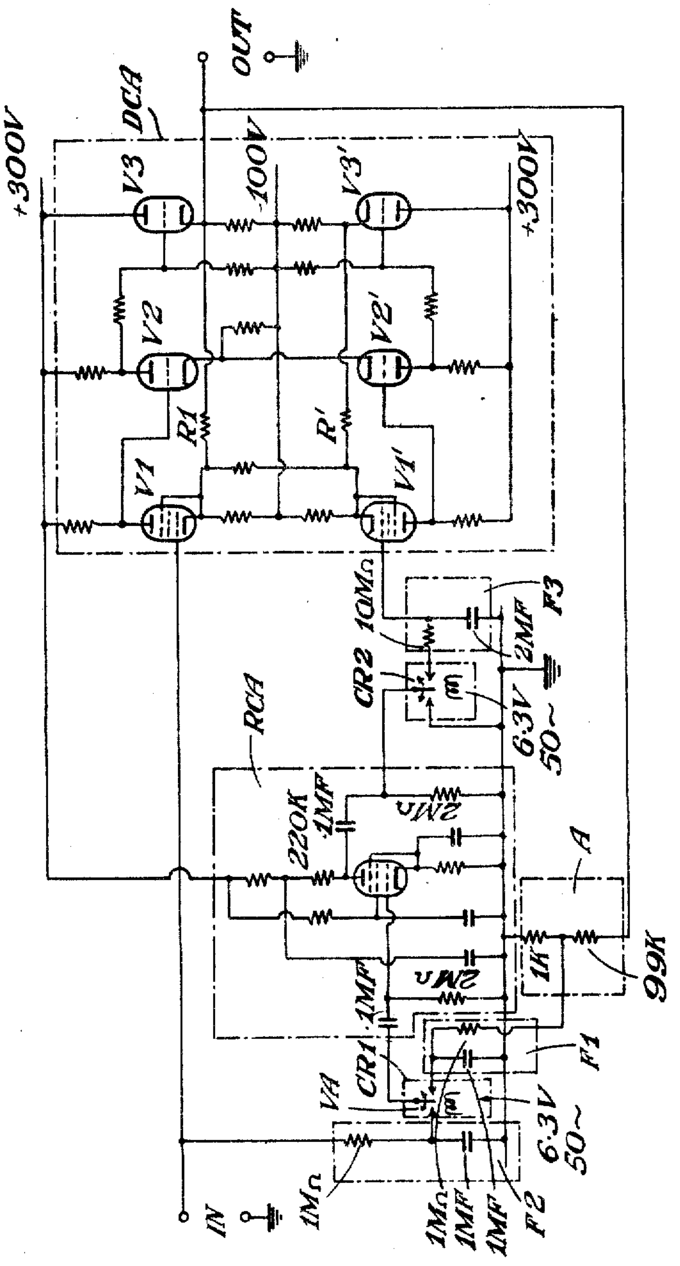
Inventor:
John Archibald Colls;
by his attorneys,
Baldwin & Wight United States Patent Office 2,709,205

Patented May 24, 1955

2,709,205

DIRECT COUPLED THERMIONIC VALVE AMPLIFIERS

John Archibald Colls, Fernhill, Hawley, Camberley, England, assignor to Southern Instruments Limited, Fernhill, Hawley, Camberley, England, a company of Great Britain Application June 23, 1950, Serial No. 169,965

Claims priority, application Great Britain July 6, 1949

10 Claims. (Cl. 179—171)

This invention relates to direct coupled thermionic valve amplifiers and has for its object to provide improved direct coupled amplifier circuit arrangements which will give high gain, good response at higher frequency signal components and at the same time be to a large extent free from drift.

For many purposes, particularly in oscillography, a high gain amplifier which will retain the D. C. component of the voltage to be studied and at the same time give good response at higher frequency components is required. Socalled direct coupled amplifiers are largely used in such cases but a common difficulty experienced is that, if high gain is obtained, noticeable drift is very apt to occur due to unavoidable variations in H. T. or L. T. supply voltages, variations with working temperature of the valves and amplifier components, variations in valve emission and similar causes. By using balanced stages throughout and taking great care to ensure highly stabilized voltage supplies, drift may be reduced to a substantial extent but such precautions are troublesome and costly and, even so, the amplifier must be left switched on for a long time before it reaches a steady working temperature at which it is satisfactorily stable. The present invention seeks to avoid these defects by providing drift correction under control of the amplifier output applied to an attenuator connected through low pass filters and a switching system which combines the filter outputs to produce a resultant wave form dependent upon the difference between the two filter outputs that is phase selected and rectified to obtain a control current which is impressed upon the amplifier for correcting for drift.

According to this invention an amplifier circuit arrangement comprises in combinations a direct coupled. amplifier, an attenuator fed from the output of said amplifier and having a voltage reduction factor substantially equal to the gain of said amplifier, a low pass filter fed with the output from said attenuator, a second similar low pass filter fed in parallel with the input circuit of said amplifier, a switching system for combining the filter outputs to produce a resultant wave form of amplitude dependent upon the difference between the two filter outputs, an amplifier for amplifying said resultant wave and a phase selective rectifier for rectifying the amplified wave form to produce a corresponding D. C. output which is fed into the amplifier to correct for drift therein.

The switching system may conveniently be a relay switch driven for example at mains frequency, say 50 c./s. or, if desired, at some other, higher frequency, say 200 c./s. and the rectifier may be a similar relay switch which is similarly driven and is preferably so connected that during one half-cycle of the driving frequency the amplifier output passed to said relay switch is held at earth potential while during the other half cycle the said switch acts as a rectifier. In this way an action analogous to that of a restoring diode is obtained.

The correcting voltage may be superimposed in the amplifier input in any of a number of ways but preferably at least the first stage of the amplifier is in the form of a remote cutoff push pull amplifier with the input signal applied to a control grid of one valve of the pair and the correcting voltage applied to a control grid of the other.

The invention is illustrated in the accompanying drawing which shows diagrammatically one embodiment thereof. Certain practical values of components and applied voltages are indicated conventionally in the figure but it is to be understood that these are given purely by way of example and that they are in no way limiting values.

Referring to the figure signals to be amplified are applied from input terminals to a direct coupled amplifier DCA of known form and illustrated as comprising two amplifying stages each consisting of a pair of valves V1, V1′, V2, V2′, connected as a remote cutoff push pull amplifier and two cathode followers V3, V3′. Negative feed back is provided in the amplifier through paths including resistance $R_1$, R′, and output is taken from the output terminals OUT. The "live" output terminal is connected to an attenuator A whose output is passed to a low pass filter F1. The voltage reduction factor of the attenuator A is the same as the gain of the amplifier DCA so that, if the amplifier and attenuator are initially correctly set up and no drift has occurred the attenuator output will be exactly the same as the amplifier input. The output from attenuator A is fed to one fixed contact of a switching system constituted by a relay switch CR1 whose vibratory armature VA is driven by a coil VC fed at a desired chosen frequency. The other fixed contacts of the relay CR1 is fed through a similar low pass filter F2. The cut off frequency of the filters F1, F2 is much lower than the 50 cycle operating frequency of the relay switch CR1, the output from which will consist of a substantially rectangular wave form whose peak-to-peak amplitude will be equal to the difference between the two signals fed in from the filters F1 and F2. This output is amplified by a single stage resistance-capacity coupled amplifier and thence passed to a rectifier constituted by a second relay switch CR2 like the relay switch CR1 and driven from the same source. It will be noted that one fixed contact (the left hand one in the figure) of relay switch CR2 is earthed, the other co-operating with the vibratory armature to rectify the output from the amplifier RCA and feed it via a smoothing filter F3 as correcting voltage to the input side of the amplifier DCA. As will be seen this correcting input is applied to the control grid of the valve V1′ of the remote cutoff, push pull amplifier whose other valve V1 receives input signals from the live terminal of the input terminals IN. As will be obvious the polarity of the correcting voltage is made such as to tend to restore to zero any difference between the outputs from filters F1 and F2 so that correction for drift is obtained and although the compensation obtained is not absolute drift will be reduced by a factor roughly equal to the gain of the amplifier RCA.

It will be observed that, owing to the connections of the relay switch CR2 the output from amplifier RCA is held at earth potential for substantially half the cycle while during the other half cycle the condenser in the filter F3 is charged to the peak-to-peak value of the amplified wave from amplifier RCA, whatever the sign of this value. There is thus a D. C. restoring action and the D. C. output is doubled as compared to what would occur if the amplified wave form were centered about earth.

I claim:

1. An amplifier circuit arrangement comprising in combination a direct coupled amplifier, an attenuator fed from the output of said amplifier and having a voltage reduction factor substantially equal to the gain of said amplifier, a low pass filter fed with the output from said attenuator, a second similar low pass filter fed in parallel with the input circuit of said amplifier, means including a switching circuit arrangement for combining the outputs from the two filters thereby to produce a resultant wave form of amplitude dependent upon the difference between the two filter outputs, an amplifier for amplifying said resultant wave and a phase selective rectifier for rectifying the amplified wave form thereby to produce a corresponding D. C. output, and means feeding said output into said direct coupled amplifier thereby to correct for drift thereof.

2. An amplifier circuit arrangement comprising in combination a direct coupled amplifier, an attenuator fed from the output of said amplifier and having a voltage reduction factor substantially equal to the gain of said amplifier, a low pass filter fed with the output from said attenuator, a second similar low pass filter fed in parallel with the input circuit of said amplifier, means including an A. C. driven relay switch for combining the outputs from the two filters thereby to produce a resultant wave form of amplitude dependent upon the difference between the two filter outputs, an amplifier for amplifying said resultant wave and a phase selective rectifier for rectifying the amplified wave form thereby to produce a corresponding D. C. output, and means feeding said output into said direct coupled amplifier thereby to correct for drift thereof.

3. An amplifier circuit arrangement as set forth in claim 1 wherein the phase selective rectifier includes an A. C. driven relay switch.

4. An amplifier circuit arrangement as set forth in claim 2 wherein the phase selective rectifier includes an A. C. driven relay switch.

5. An amplifier circuit arrangement as set forth in claim 2 wherein the phase selective rectifier includes an A. C. driven relay switch and circuit means connected to the relay switch included in the phase selective rectifier for holding the amplifier output passed thereto at earth potential during alternate half cycles of the A. C. driving wave therefor.

6. An amplifier circuit arrangement comprising in combination a direct coupled amplifier said amplifier having a first stage in the form of a remote cutoff push pull amplifier including at least one pair of valves each having a cathode, a control grid and an anode, means applying input signals to the control grid of one valve of said pair, an attenuator fed from the output of said amplifier and having a voltage reduction factor substantially equal to the gain of said amplifier, a low pass filter fed with the output from said attenuator, a second similar low pass filter fed in parallel with the input circuit of said amplifier, means including a switching circuit arrangement for combining the outputs from the two filters thereby to produce a resultant wave form of amplitude dependent upon the difference between the two filter outputs, an amplifier for amplifying said resultant wave and a phase selective rectifier for rectifying the amplified wave form thereby to produce a corresponding D. C. output, and means feeding said output into said direct coupled amplifier thereby to correct for drift thereof said output being applied to the control grid of the other valve of said pair of valves in said remote cutoff push pull amplifier.

7. An amplifier circuit arrangement comprising in combination a direct coupled amplifier, said amplifier having a first stage in the form of a remote cutoff push pull amplifier including at least one pair of valves each having a cathode, a control grid and an anode, means applying input signals to the control grid of one valve of said pair, an attenuator fed from the output of said amplifier and having a voltage reduction factor substantially equal to the gain of said amplifier, a low pass filter fed with the output from said attenuator, a second similar low pass filter fed in parallel with the input circuit of said amplifier, means including an A. C. driven relay switch for combining the outputs from the two filters thereby to produce a resultant wave form of amplitude dependent upon the difference between the two filter outputs, an amplifier for amplifying said resultant wave and a phase selective rectifier for rectifying the amplified wave form thereby to produce a corresponding D. C. output, and means feeding said output into said direct coupled amplifier thereby to correct for drift thereof said output being applied to the control grid of the other valve of said pair of valves in said remote cutoff push pull amplifier.

8. An amplifier circuit arrangement as set forth in claim 7 wherein the phase selective rectifier includes an A. C. driven relay switch.

9. An amplifier of the character described comprising, a direct-coupled amplifier adapted to have a control signal potential impressed on its input, means coupled to the output of said direct-coupled amplifier for deriving from the output thereof a signal potential whose amplitude is equal to the output signal of said direct-coupled amplifier divided by the gain thereof, means for comparing said control signal with the derived portion of said output signal to produce a difference signal, means for amplifying said difference signal, and means operative in accordance with the amplified difference signal for controlling the static potential of said direct-coupled amplifier.

10. An amplifier of the character described comprising, a direct-coupled amplifier having a control potential impressed on its input, a source of reference potential, an alternating current amplifier, means for comparing said control potential with said reference potential to obtain a difference potential, means for converting said difference potential to an alternating potential, circuit means impressing said alternating current potential on the input of said alternating current amplifier, means for rectifying the alternating current output of said alternating current amplifier to produce a direct current potential proportional to said alternating current output, and means responsive to said direct current potential for adjusting the static potential level impressed on said direct-coupled amplifier to compensate for the zero drift thereof.

References Cited in the file of this patent

UNITED STATES PATENTS 2,459,730 Williams, Jr. ____________ Jan. 18, 1949

Notice of Adverse Decision in Interference

In Interference No. 87,862 involving Patent No. 2,709,205, J. A. Colls, Direct coupled thermionic valve amplifiers, final judgment adverse to the patentee was rendered March 25, 1957, as to claims 9 and 10.

[*Official Gazette May 21, 1957.*]